(12) United States Patent
Luo et al.

(10) Patent No.: US 9,484,939 B2
(45) Date of Patent: Nov. 1, 2016

(54) TECHNIQUES FOR FRACTIONAL-N PHASE LOCKED LOOPS

(71) Applicant: LATTICE SEMICONDUCTOR CORPORATION, Portland, OR (US)

(72) Inventors: Kexin Luo, Shanghai (CN); Kai Zhou, Shanghai (CN); Shengguo Cao, Shanghai (CN); Lingfen Yue, Shanghai (CN); Fangquing Chu, Mountain View, CA (US); Yu Shen, Beijing (CN); Zhi Wu, Shanghai (CN)

(73) Assignee: Lattice Semiconductor Corporation, Portland, OR (US)

( * ) Notice: Subject to any disclaimer, the term of this patent is extended or adjusted under 35 U.S.C. 154(b) by 199 days.

(21) Appl. No.: 14/383,865

(22) PCT Filed: May 16, 2014

(86) PCT No.: PCT/CN2014/077643
§ 371 (c)(1),
(2) Date: Sep. 8, 2014

(87) PCT Pub. No.: WO2015/172372
PCT Pub. Date: Nov. 19, 2015

(65) Prior Publication Data
US 2016/0248431 A1    Aug. 25, 2016

(51) Int. Cl.
*H03L 7/06* (2006.01)
*H03L 7/197* (2006.01)
*H03L 7/089* (2006.01)
*H03L 7/091* (2006.01)
*H03L 7/093* (2006.01)
*H03M 3/00* (2006.01)

(52) U.S. Cl.
CPC .......... *H03L 7/1976* (2013.01); *H03L 7/0891* (2013.01); *H03L 7/091* (2013.01); *H03L 7/093* (2013.01); *H03M 3/30* (2013.01)

(58) Field of Classification Search
USPC ................... 327/147–149, 156–158
See application file for complete search history.

(56) References Cited

U.S. PATENT DOCUMENTS

| 7,116,144 | B1 | 10/2006 | Cheng | |
| 7,181,180 | B1* | 2/2007 | Teo | H03L 7/081 331/17 |
| 7,330,078 | B1* | 2/2008 | Li | H03L 7/18 327/156 |

(Continued)

FOREIGN PATENT DOCUMENTS

| CN | 1338823 A | 3/2002 |
| CN | 101409555 A | 4/2009 |

(Continued)

OTHER PUBLICATIONS

PCT International Search Report, PCT Application No. PCT/CN2014/077643, Feb. 16, 2015, 14 pages.

*Primary Examiner* — Adam Houston
(74) *Attorney, Agent, or Firm* — Fenwick & West LLP

(57) ABSTRACT

Embodiments describe techniques for utilizing fractional-N phase locked loops (PLL). Some embodiments describe a fractional-divider based fractional-N PLL for a spread spectrum clock (SSC) generator that utilizes phase average techniques to suppress phase interpolator nonlinearity. Some embodiments describe a fractional-N PLL based on fractional dividers with hybrid finite impulse response (FIR) filtering. Some embodiments describe a small size and low power divider for a hybrid FIR fractional-N PLL.

14 Claims, 19 Drawing Sheets

(56) References Cited

U.S. PATENT DOCUMENTS

| | | | | |
|---|---|---|---|---|
| 7,492,195 B1* | 2/2009 | Patil | .................. | H03L 7/1976 327/147 |
| 8,692,594 B2* | 4/2014 | Foxcroft | .................. | H03L 7/183 327/147 |
| 8,836,434 B2* | 9/2014 | Bellaouar | .................. | H03C 3/0991 327/156 |
| 9,236,873 B1* | 1/2016 | Buell | .................. | H03L 7/0992 |
| 2003/0108143 A1* | 6/2003 | Han | .................. | H03L 7/1978 377/47 |
| 2003/0137359 A1* | 7/2003 | Patana | .................. | H03L 7/1978 331/100 |
| 2003/0235261 A1* | 12/2003 | Patana | .................. | H03M 7/3022 375/376 |
| 2008/0303566 A1* | 12/2008 | Shen | .................. | H03L 7/193 327/157 |
| 2008/0309420 A1 | 12/2008 | Fu et al. | | |
| 2010/0127739 A1* | 5/2010 | Ebuchi | .................. | H03L 7/0898 327/148 |
| 2010/0164562 A1* | 7/2010 | Tseng | .................. | G06F 1/08 327/118 |
| 2010/0214031 A1* | 8/2010 | Yamamoto | .................. | H03L 7/087 331/34 |
| 2011/0204940 A1* | 8/2011 | Kanda | .................. | H03C 3/095 327/157 |
| 2012/0105114 A1* | 5/2012 | Yun | .................. | H03L 7/1976 327/156 |
| 2012/0242384 A1* | 9/2012 | Kato | .................. | H03L 7/097 327/157 |
| 2013/0249609 A1* | 9/2013 | Taki | .................. | H03L 7/183 327/156 |
| 2013/0285722 A1* | 10/2013 | Chou | .................. | H03L 7/0898 327/157 |
| 2014/0015578 A1* | 1/2014 | Gebre-Selassie | .................. | H03L 7/06 327/157 |
| 2014/0159787 A1* | 6/2014 | Hsu | .................. | H03L 7/1976 327/156 |
| 2015/0061736 A1* | 3/2015 | Mai | .................. | H03C 3/00 327/156 |

FOREIGN PATENT DOCUMENTS

| | | |
|---|---|---|
| CN | 101536314 A | 9/2009 |
| CN | 101854158 A | 10/2010 |
| CN | 102006065 A | 4/2011 |

* cited by examiner

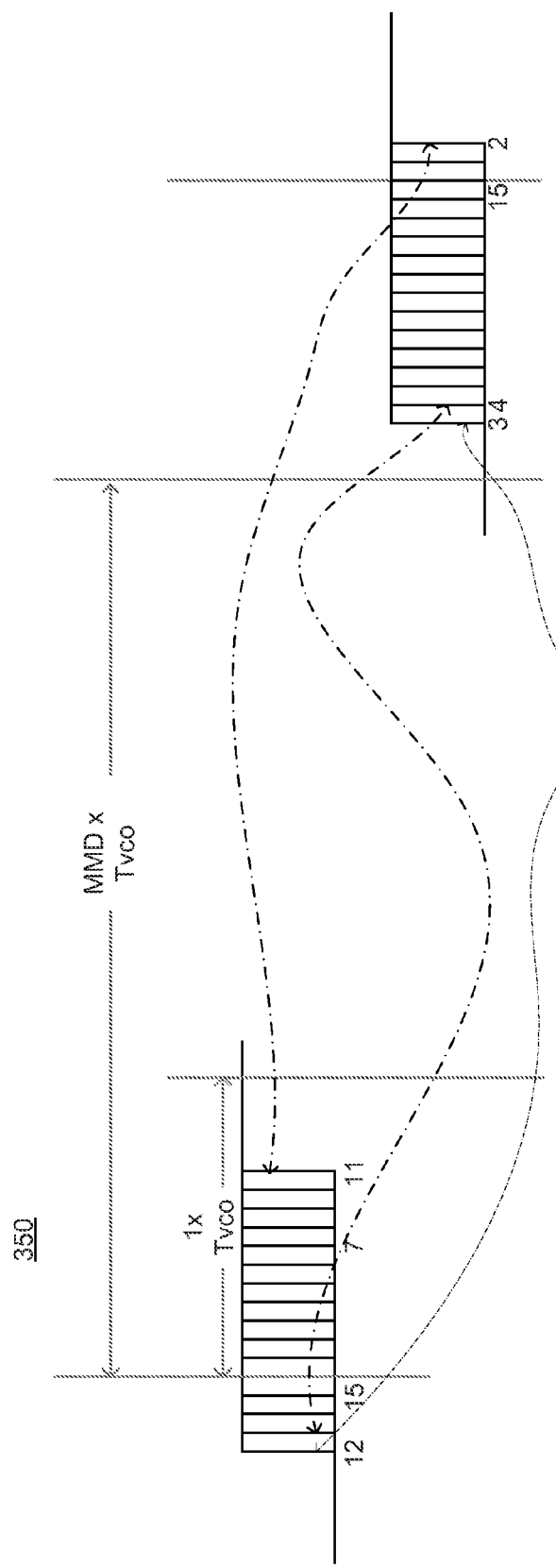

TECHNIQUES FOR FRACTIONAL-N PHASE LOCKED LOOPS

TECHNICAL FIELD

Embodiments of the invention generally relate to the field of electronic circuits, and, more particularly, to fractional-dividers and/or fractional-n phase locked loops for spread spectrum clock generators.

BACKGROUND

Spread Spectrum Clock (SSC) signals are used by electronic devices in order to suppress Electro Magnetic Interference (EMI). SSC signals are clocks with changing frequencies, usually oscillating between minimum/maximum values, according to a desired modulation profile function (e.g., sine wave, triangle wave, etc.). SSC signals may be generated by modulating the frequency of a clock signal generated by a Phase Locked Loop (PLL) circuit in accordance with a predetermined modulation frequency and modulation degree. A sigma-delta modulator based fractional-N PLL may be used to generate an SSC signal; however, the quantization noise of sigma-delta modulators introduces jitter to the PLL output.

BRIEF DESCRIPTION OF THE DRAWINGS

Embodiments of the disclosure are illustrated by way of example, and not by way of limitation, in the figures of the accompanying drawings in which like reference numerals refer to similar elements.

FIG. 3B is an illustration of waveform of a phase average technique according to an embodiment of the disclosure.

SUMMARY

Embodiments describe techniques for utilizing fractional-N phase locked loops (PLL). Some embodiments describe a fractional-divider based fractional-N PLL for a spread spectrum clock (SSC) generator that utilizes phase average techniques to suppress phase interpolator nonlinearity. Some embodiments describe a fractional-N PLL based on fractional dividers with hybrid finite impulse response (FIR) filtering. Some embodiments describe a small size and low power divider for a hybrid FIR fractional-N PLL.

DETAILED DESCRIPTION

Embodiments of an apparatus, system and method for fractional dividers and fractional-n phase locked loops (PLLs) for spread spectrum clock (SSC) generators are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

In some embodiments of the disclosure, sigma-delta modulator based fractional-N PLLs may be used to generate SSC signals, which are used by electronic devices in order to suppress Electro Magnetic Interference (EMI). The quantization noise generated by sigma-delta modulators may introduce jitter to the PLL output; in order to reduce this quantization noise, embodiments of the disclosure may utilize multi-phase dividers, finite infinite response (FIR) filters, and digital-to-analog converter (DAC) compensation techniques described below.

Phase rotators or Phase Interpolators (PIs) allow the phase of its sampling clocks to be adjusted in very fine increments. Fractional-N dividers allow PLL synthesizers to have a frequency resolution finer than the reference frequency. Fractional dividers may include a PI and may be used in integer PLLs if the divider ratio step is fine enough, or it may be used for sigma-delta based fractional-N PLLs to reduce quantization noise; however, the nonlinearity of PIs may cause spurs or tones in the output clock spectrum. As described below, processes referred to herein as "phase average techniques," are used to suppress the nonlinearity of a PI and remove the spurs and tones in the output clock spectrum.

Figure 1:
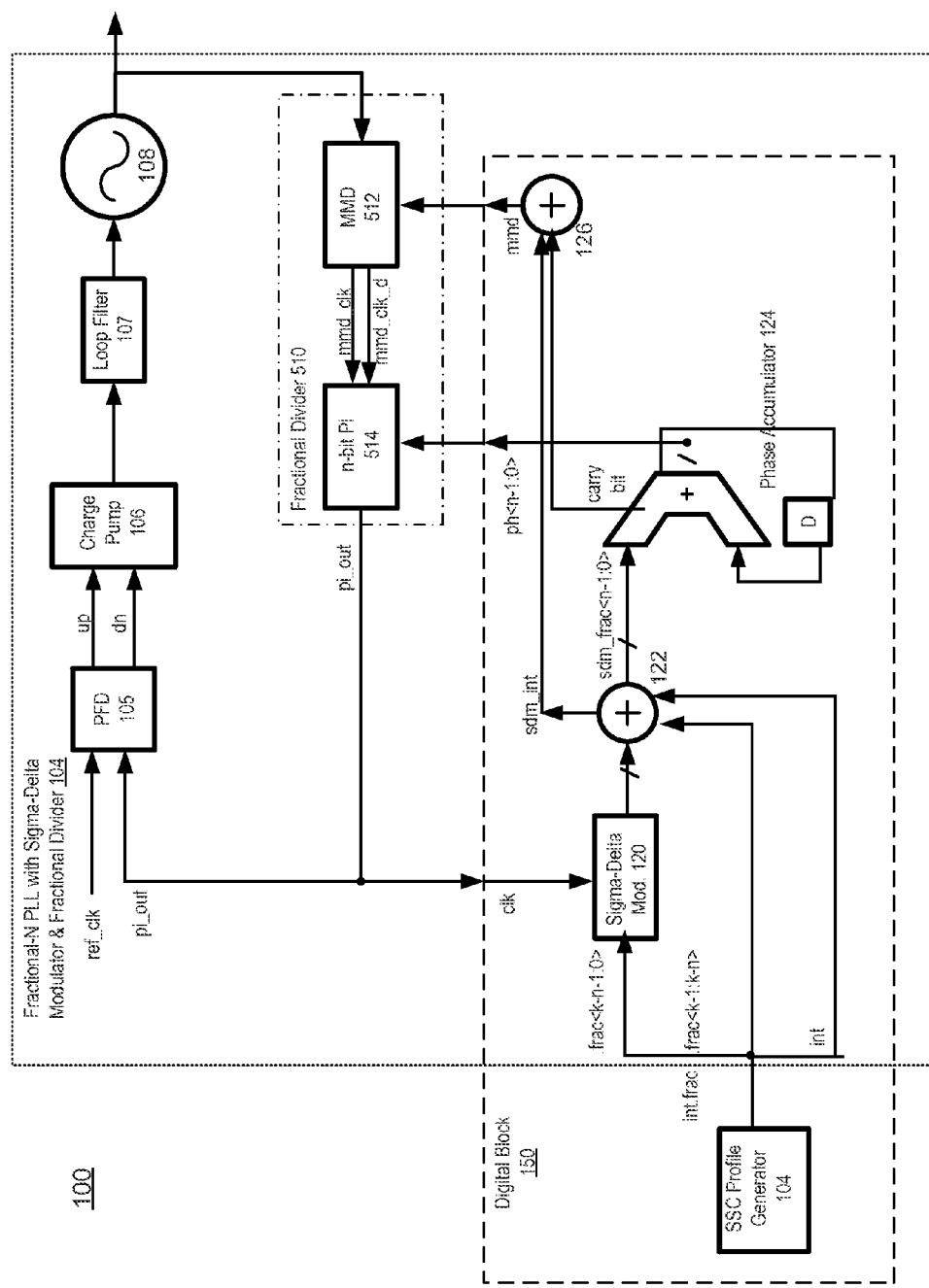
FIG. 1 is an illustration of a spread spectrum clock generator circuit according to an embodiment of the disclosure.

FIG. 1 is an illustration of a spread spectrum clock generator circuit according to an embodiment of the disclosure. In this embodiment, SSC generation circuit 100 includes Fractional-N PLL 104 shown to further include phase-frequency detector (PFD) 105 which receives a reference clock signal, shown as "ref_clk," and the output of fractional divider 110 (described further below), which is shown as "pi_out." PFD 105 may compare the frequency and phase difference between the ref_elk and pi_out. For example, when the rising edge ref_clk leads (or lags) pi_out, PFD 105 may produce an up (or down) pulse with a duration equal to the phase difference between them. PFD 105 is shown to provide up and down signals to charge pump 106; loop filter 107 filters the up/dn pulses and provides an increased/decreased output to control voltage controlled oscillator (VCO) 108, wherein the increased/decreased control voltage increase/decrease the oscillation frequency of the VCO. The output of VCO 108, shown as "vco_clk," is the SSC output signal of circuit 100, and should compare to the "vco_clk" without SSC modulation.

Fractional divider 110, wherein the divider values vary for each period, includes Multi-Modulus Divider (MMD) 112, which receives vco_clk, and n-bit PI 114, which receives divided clock signals from the MMD; each component is shown to utilize separate control words—"mmd" and "ph<n−1:0>" respectively. The control word "mmd" controls the divider ratio of MMD 112, while the control word "ph<n−1:0>" selects the phase of n-bit PI 114. Said control words come from components of digital block 150, described below. Furthermore, in addition to providing an output to PFD 105, fractional divider 110 also provides an output clock "clk" to sigma delta modulator 120.

As illustrated in this figure, digital block 150 includes three subsections—SSC profile generator 104, sigma-delta modulator 120 and phase accumulator (or phase control logic for fractional divider) 124. SSC profile generator 102 provides an output to sigma-delta modulator 120. SSC profile generator 102 is shown to generate several output signals (alternatively referred to herein as "codes). The "int.frac" code is the divider ratio, wherein the "int" is the integer part of the divider ratio, and the "frac" is the fractional part of the divider ratio. Because n-bit PI 114 is used in divider 110, the divider has a step of $1/(2^n)$. As a result, the lower bit of "frac<k−n+1.0>" is input into sigma-delta modulator 120, and the output of the sigma-delta modulator are added back to the higher bit "frac<k−1:k−n>" and "int" (wherein "frac" has a length of k) at summation node 122.

The integer portion of the output of sigma delta modulator 120 is illustrated as "sdm_int", while the fractional part is "sdm_frac<n−1:0>." The code "sdm_frac<n−1:0>" is input into phase accumulator 124 (alternatively referred to herein as a phase rotator), which outputs the code "ph<n−1:0>". The code "ph<n−1:0>" controls the phase of the input to n-bit PI 114, while the code "sdm_frac<n−1:0>" controls the phase step that the PI jumps every cycle. The carry bit of the phase accumulator is added to "sdm_int" at summation node 126, and the sum "mmd" controls the divider ratio of MMD 112.

Figure 2A:
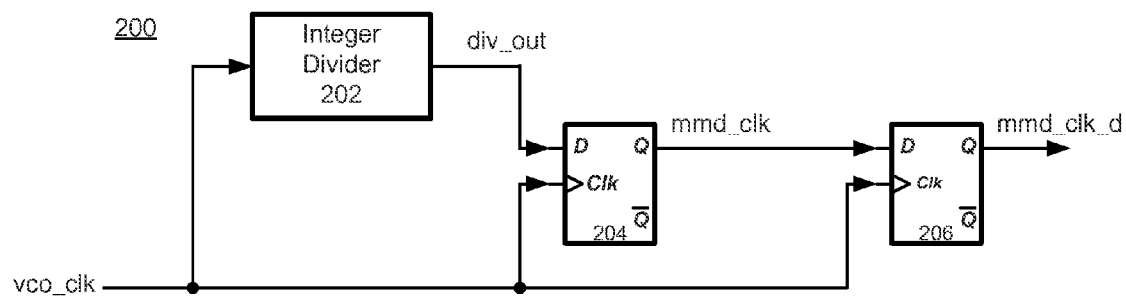
FIG. 2A is an illustration on a multi-modulus divider schematic for producing "mmd_clk" and a delayed clock "mmd_clk_d" signals according to an embodiment of the disclosure.

FIG. 2A is an illustration on an MMD schematic for producing "mmd_clk" and a delayed clock "mmd_clk_d" signals according to an embodiment of the disclosure. MMD 200 (which may, for example, correspond to MMD 112 of FIG. 1) includes integer 202 divider, and two digital flip-flops (DFFs) 204 and 206. "vco_clk" is input to integer divider 202, and it outputs the signal "div_out;" this clock is sampled by DFF 204, which is shown to be triggered by the clock signal "vco_clk", and this DFF outputs "mmd_clk." This signal is illustrated to again be sampled by DFF 206, which is also triggered "vco_clk," and this DFF outputs another clock signal "mmd_clk_d."

Figure 2B:
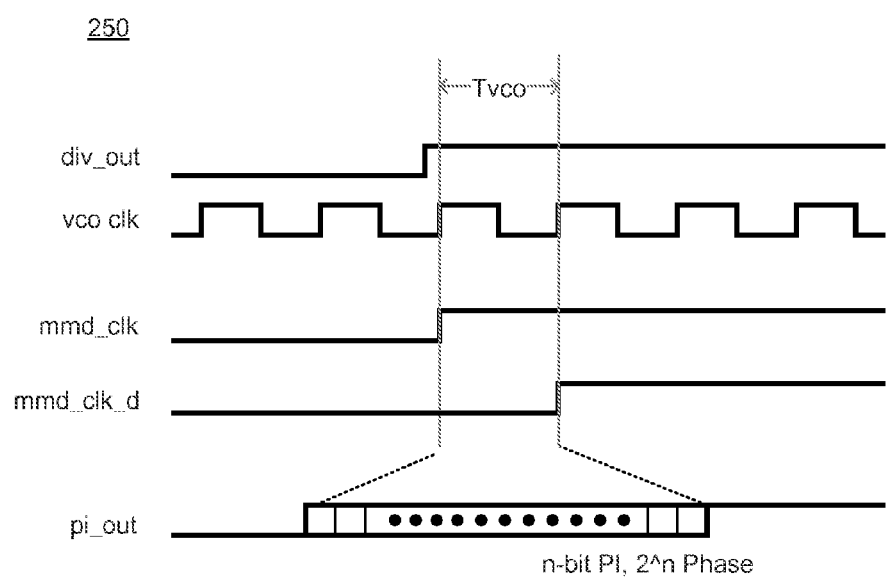
FIG. 2B is a timing diagram of multi-modulus divider and a phase interpolator according to an embodiment of the disclosure.

FIG. 2B is a timing diagram of an MMD (e.g., MMD 112 of FIG. 1) and a PI (e.g., PI 114 of FIG. 1) according to an embodiment of the disclosure. Timing diagram 250 illustrates that "mmd_clk_d" is a delay of divided clock signal "mmd_clk;" the delay period is illustrated as "Tvco," which comprises 1 VCO clock cycle. The "mmd_clk" and "mmd_clk_d" signals are input to an n-bit PI, and the PI divides the whole Tvco into $2^n$ phases (i.e., generates $2^n$ phase-shifted outputs from the phases of the input clocks).

The operation of the fractional divider may be described by the following example: a 4-bit PI may provide a $\frac{1}{16}$ phase step, and a divider ratio of (for example) $40+\frac{7}{16}$ may be realized. The procedures may be described as follows:

Assuming the "vco_clk" and the initial PI phase starts at "0," the divide ratio of the MMD may be set to "40," meaning the MMD outputs the 40th and 41st cycle of "vco_clk." The phase step of the PI may be set to "7", and the first PI output occurs at $40+\frac{7}{16}$ Tvco.

Subsequently, the MMD again is set to "40", and it provides the 80th and 81st cycle of "vco_clk;" however, the PI is set to "14," and the second PI occurs at time of $80+\frac{14}{16}$ Tvco. However, the delta time between the first and second PI output is $40+\frac{7}{16}$ Tvco.

The MMD is subsequently set to "41," and it provides the 121st and 122nd cycle of "vco_clk" to the input of the PI; the PI is set to "5." The third PI output occurs at $121+\frac{5}{16}$ Tvco, the delta time between the second and third PI output is again $40+\frac{7}{16}$ Tvco.

As a result, a fractional divider ratio of $40+\frac{7}{16}$ is realized. Referring back to FIG. 1, phase accumulator 124 is controlled by phase step control word "sdm_frac<n−1:0>" and its overflow is added to "int," which changes the divider ratio of MMD 112.

In embodiments, the PI is nonlinear, meaning the phase steps of the PI are not uniform, which may create increased quantization noise. For example, to realize a divider ratio of $40+\frac{7}{16}$, while the MMD counter of 40 cycles of "vco_clk" is constant, the phase step of the PI is non-uniform (i.e., the $\frac{7}{16}$ Tvco from ph0 to ph7 is different from that of ph1 to ph8). As a result, the PI nonlinearity may cause tones and spur, and may increase quantization noise.

Figure 3A:
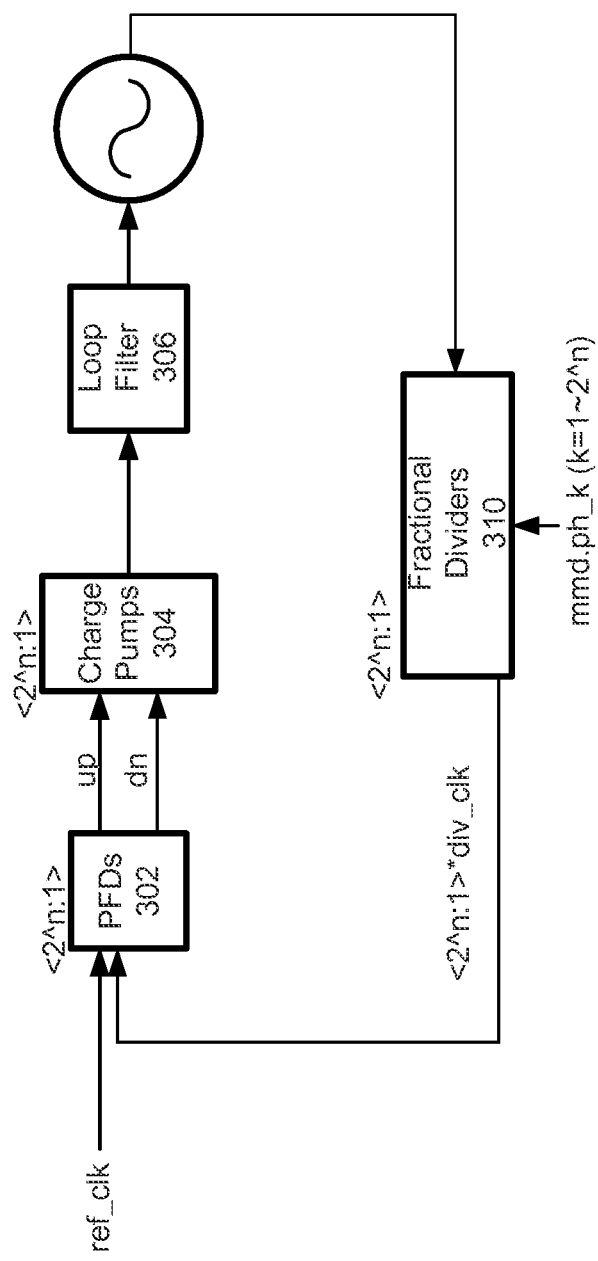
FIG. 3A is an illustration of components of a sigma-delta modulator fractional-N phased lock loop according to an embodiment of the disclosure.

FIG. 3A is an illustration of components of a sigma-delta modulator fractional-N PLL according to an embodiment of the disclosure. In this example, there are $2^n$ fractional dividers 310, PFDs 302 and charge pumps 304 coupled to loop filter 306. The charge pump current is $2^n$th of the original current. If, for example, n=4, and there are 16 fractional dividers, 16 PFDs and 16 charge pumps. Presuming that the first PI realizes a $\frac{7}{16}$ Tvco phase step by jumping from 12th phase to 3rd phase, then the second PI realizes a $\frac{7}{16}$ Tvco phase step by jumping from 13th phase to 4th phase, and so on. As a result, the sum of 16 phase jumping operations is 7 cycles, and the phase sum is averaged by 16 charge pumps; if PFDs 302 and charge pumps 304 match, then the equivalent phase step is a $\frac{7}{16}$ Tvco phase step. This example process if further illustrated by graph 350 of FIG. 3B; however, embodiments may implement fewer components and still realize most of the equivalent quantum noise suppression in the corresponding phase sum average as described below.

Figure 4A:
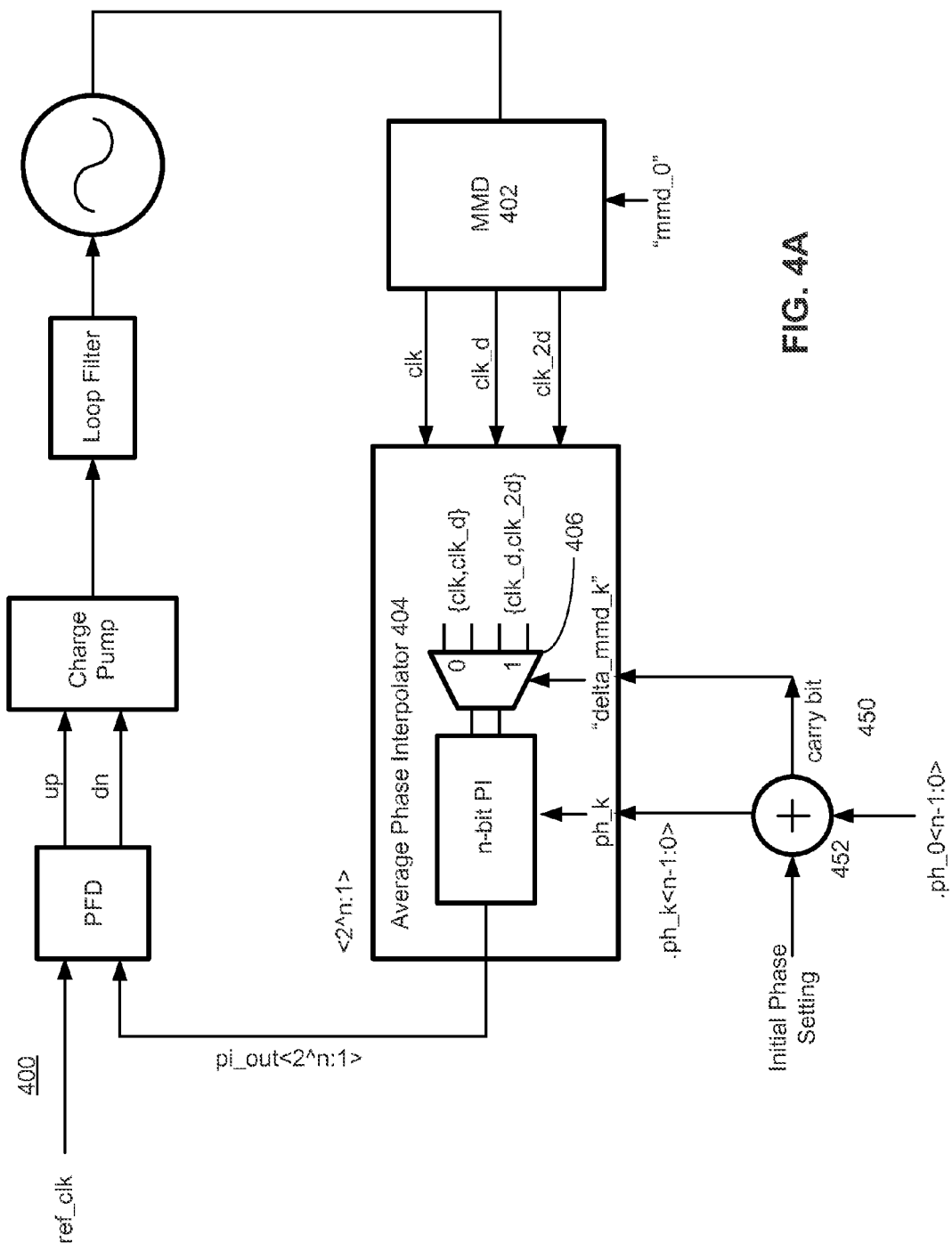
FIG. 4A and FIG. 4B are illustrations circuits to suppress phase interpolator nonlinearity using phase average operations according to an embodiment of the disclosure.
Figure 4B:
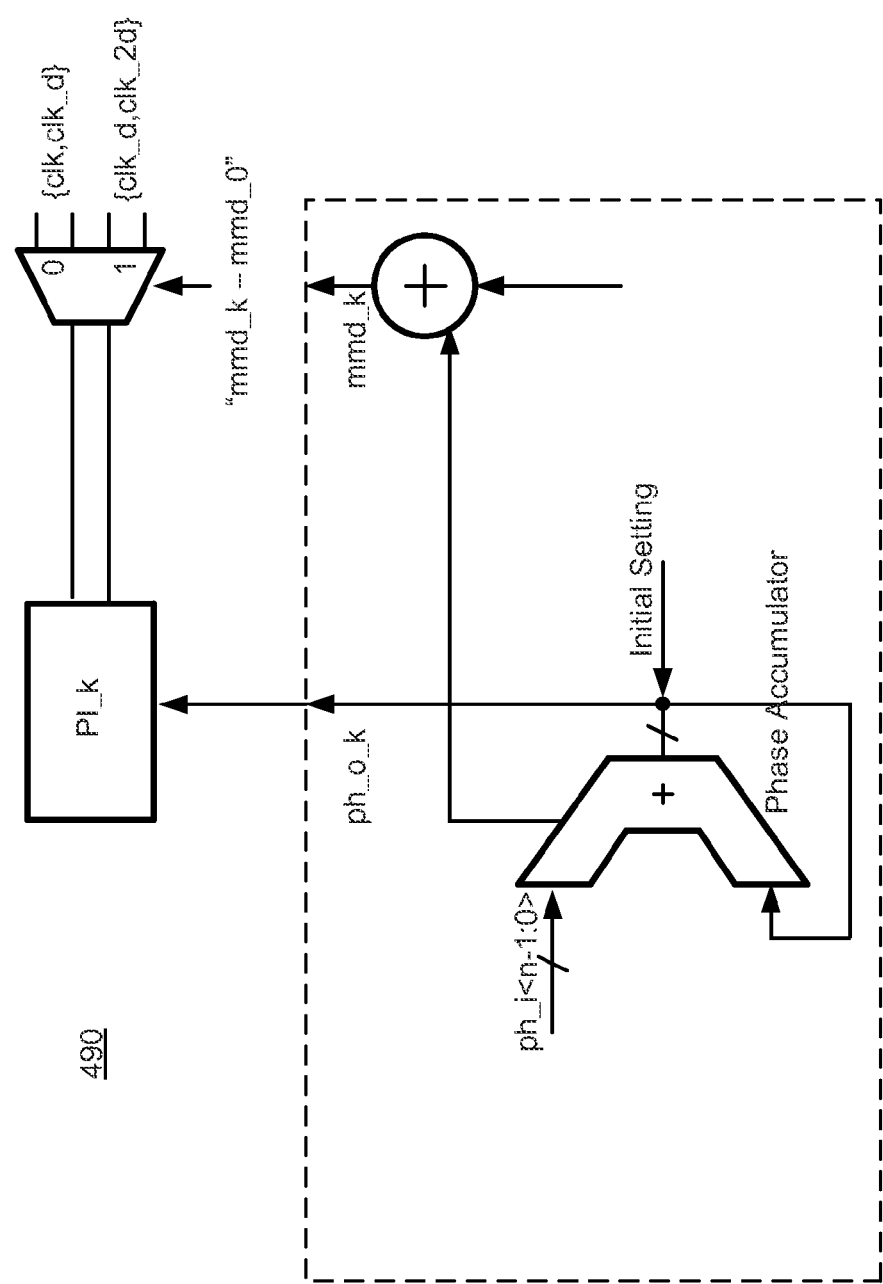

FIG. 4A and FIG. 4B are illustrations of a circuit to suppress PI nonlinearity using phase average operations according to an embodiment of the disclosure. As illustrated in circuit 400, a single common MMD 402 is utilized, and its divider ratio is controlled by signal "mmd_0."

This signal is shown to be generated by control logic 490 of FIG. 4B and may comprise the integer divider ratio of the first PI. In addition to signals "elk" & "clk_d", MMD 402 is shown to provide another clock "clk_2d," which is 2 Tvco delays of "clk."

Similar to the embodiments described above, $2^n$ PIs 404 are used, and they are controlled by the signal "ph_k" wherein, as shown by control circuit 450, k varies from 1 to 2"". MUXs 406 (no 406 in FIG. 4) are used for each of each PIs 404; each MUX selects either one group of clock signals (shown as {clk, clk_d}) or another group clock signals (shown as {clk_d, clk_2d}) to input to their respective PI.

Each of MUXs 406 are shown to be controlled by signal "delta_mmd_k;" in this example, the control word is a single bit to select from the two group clock signals. As shown in control circuit 450, the "ph_k" and "delta_mmd_k" signals come from the output of summation node 452. For example if the ph_0 at a cycle is 9/16, and the initial phase of kth phase interpolator is set to 11/16, then the "ph_k" is "2/16" while the "delta_mmd_k" is "1".

In this embodiment, the initial phase depends on the desired phase average; for example, if the desired phase average granularity is 16, then the first phase accumulator would be initially set to 0/16, the first PI jumps from phase 0 at the beginning, the second phase accumulator is initially set to 1/16, then the second PI jumps from phase 1 at the beginning. And so forth for the remaining PIs (i.e., the third PI jumps from phase "2" at the beginning, and the 16th PI jumps from the phase "15.)" However, embodiments may implement fewer components and still realize most of the equivalent quantum noise suppression in the corresponding phase sum average. For a desired phase average granularity of 4, the 1st PI will jumps from phase "0" at the beginning, the 2nd PI jumps from phase "4" initially, the 3rd PI will jumps from phase "8" initially, and 4th PI will jumps from phase "12" initially. As a result, in this embodiment only 3 additional PFDs and 3 additional PIs are used compared to prior art solutions.

As discussed above, the quantization noise of sigma-delta modulators in a fractional-N PLL introduces jitter to the output clock. In some embodiments, a hybrid FIR feedback divider based on fractional dividers may be used to reduce quantization noise, and also suppress the spur and noise caused by the nonlinearity of the utilized PIs.

Figure 5:
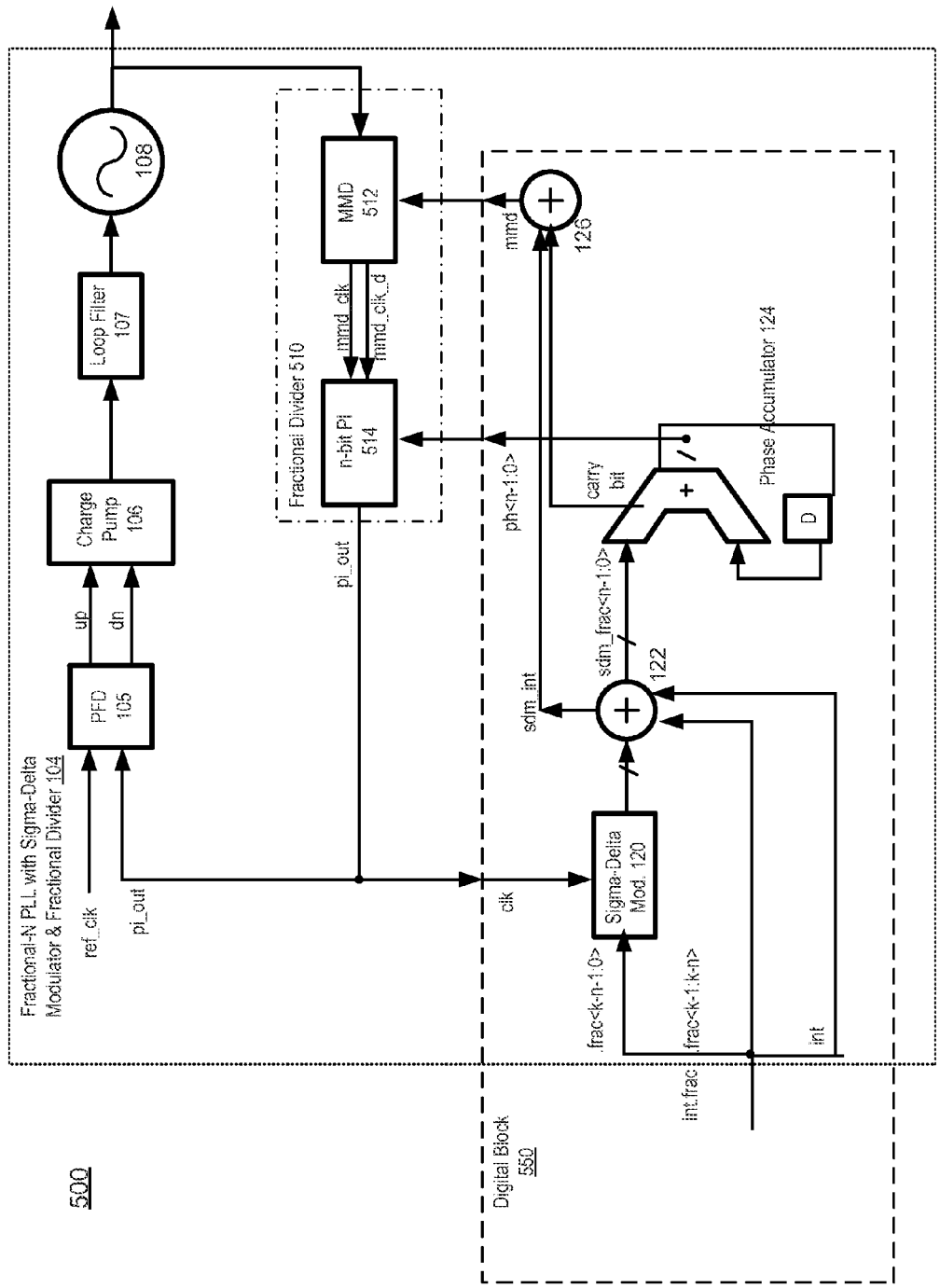
FIG. 5 is an illustration of a spread spectrum clock generator circuit according to an embodiment of the disclosure.

FIG. 5 is an illustration of an SSC generator circuit according to an embodiment of the disclosure. In this embodiment, SSC generation circuit 500 includes the same functional components as SSC generation circuit 100 of FIG. 1, except digital block 550 does not include an SSC profile generator (i.e., in contrast to SSC profile generator 104 of FIG. 1).

The quantization noise of sigma-delta modulator 120 in the fractional-N PLL may introduce jitter to the output clock; in some embodiments, in order to reduce the quantization noise, several techniques such as multi-phase divider, FIR, and DAC compensation techniques are used. In the embodiments described below, a hybrid FIR feedback divider based on fractional dividers is used to reduce quantization noise (in addition to suppress sing the spur and noise caused by the nonlinearity of the PI), and this solution may utilize only a single MMD.

As shown in the figure, MMD 512 and n-bit PI 514 form fractional divider 510, and they utilize separate control words "mmd" and "ph<n−1:0>", respectively. The control word "mmd" controls the divider ratio of the MMD divider, while the control word ph<n−1:0> selects the phase of the n-bit PI. Both of the two control words come from digital block 550. The digital block may be divided into 2 parts— portion involving sigma-delta modulator 120 and the portion involving phase accumulator 124 (or phase control logic for fractional divider 510).

Figure 6A:
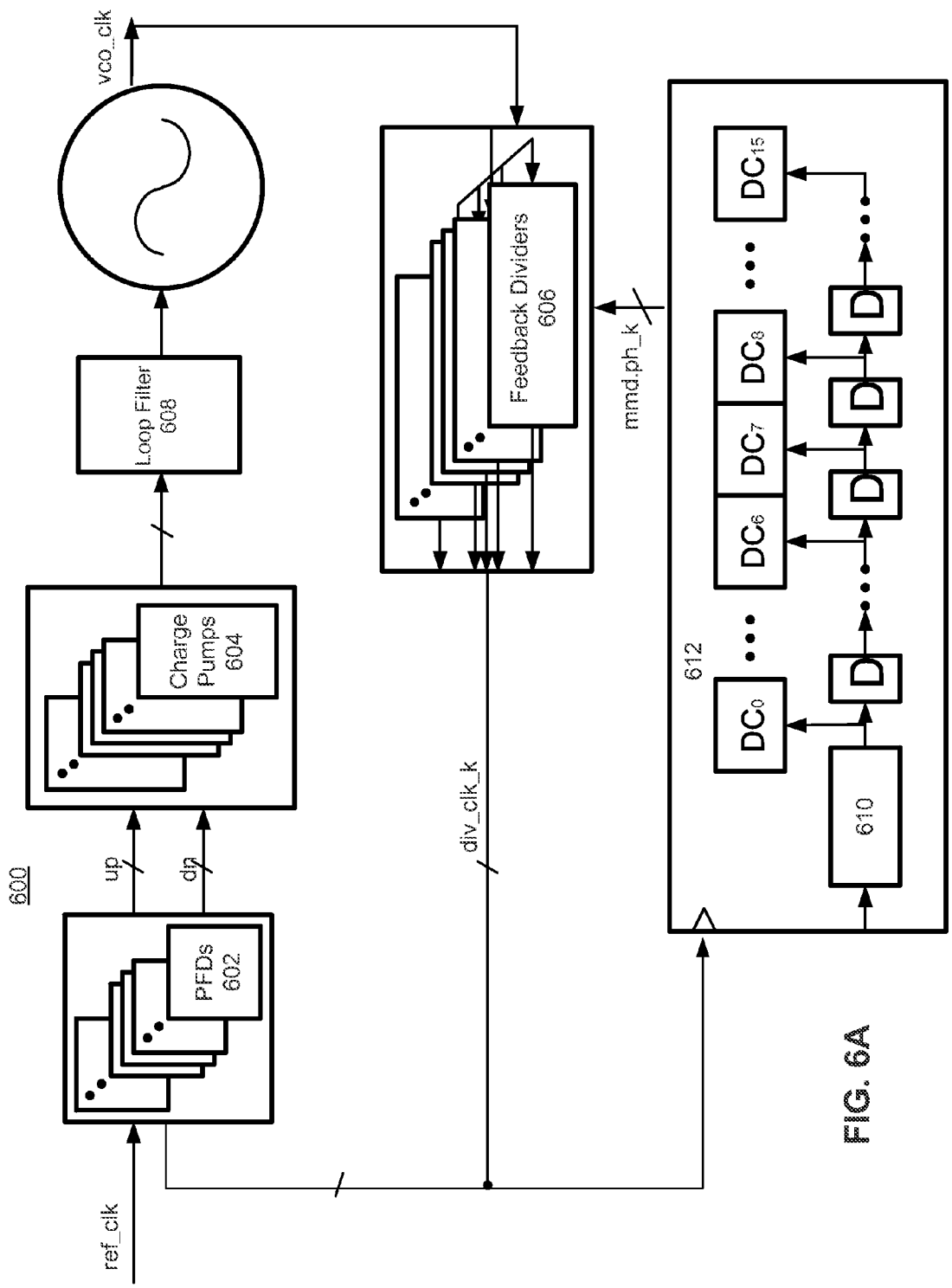
FIG. 6A-FIG. 6C illustrate hybrid finite impulse response filtering components for filtering quantization noise according to an embodiment of the disclosure.
Figure 6B:
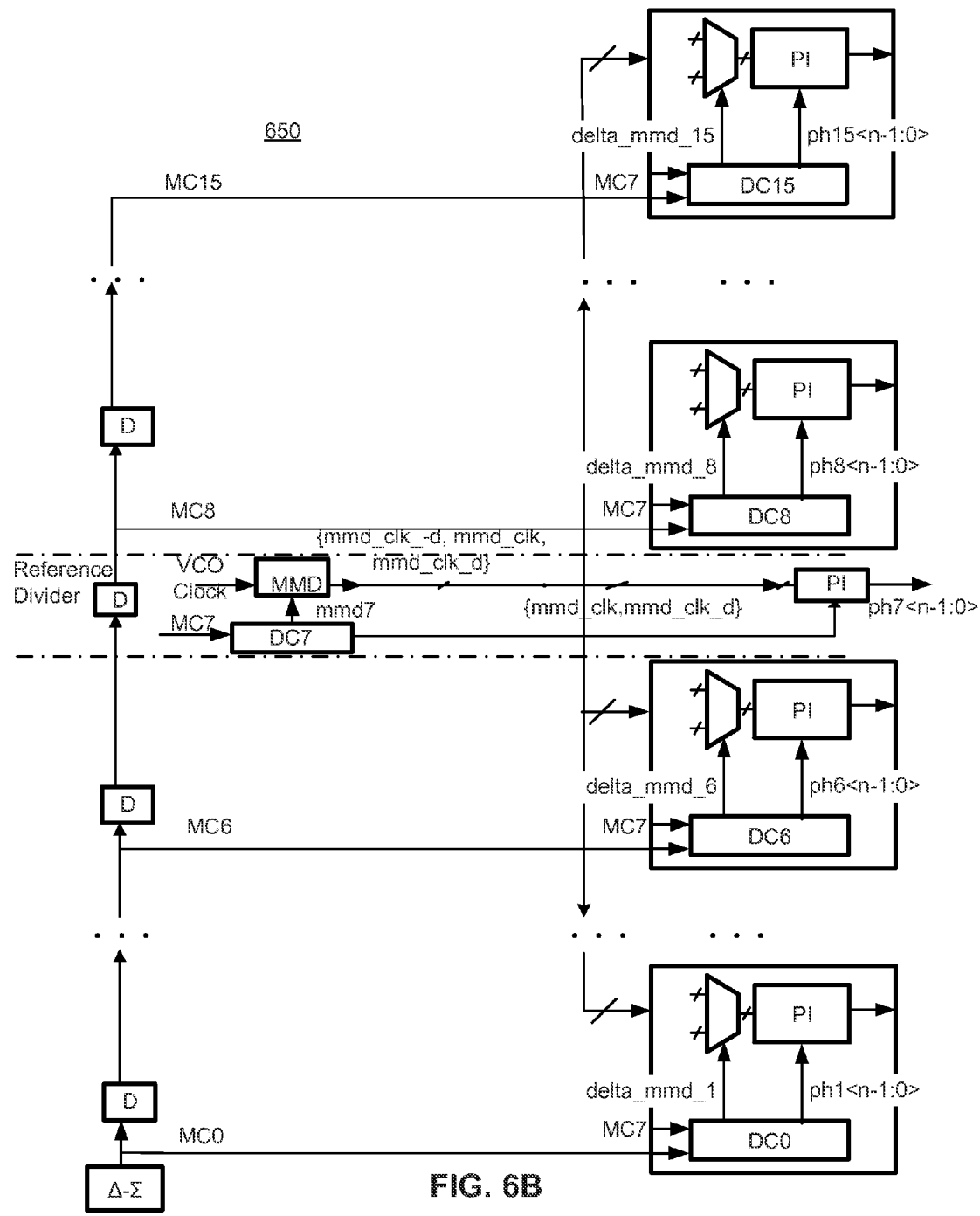
Figure 6C:
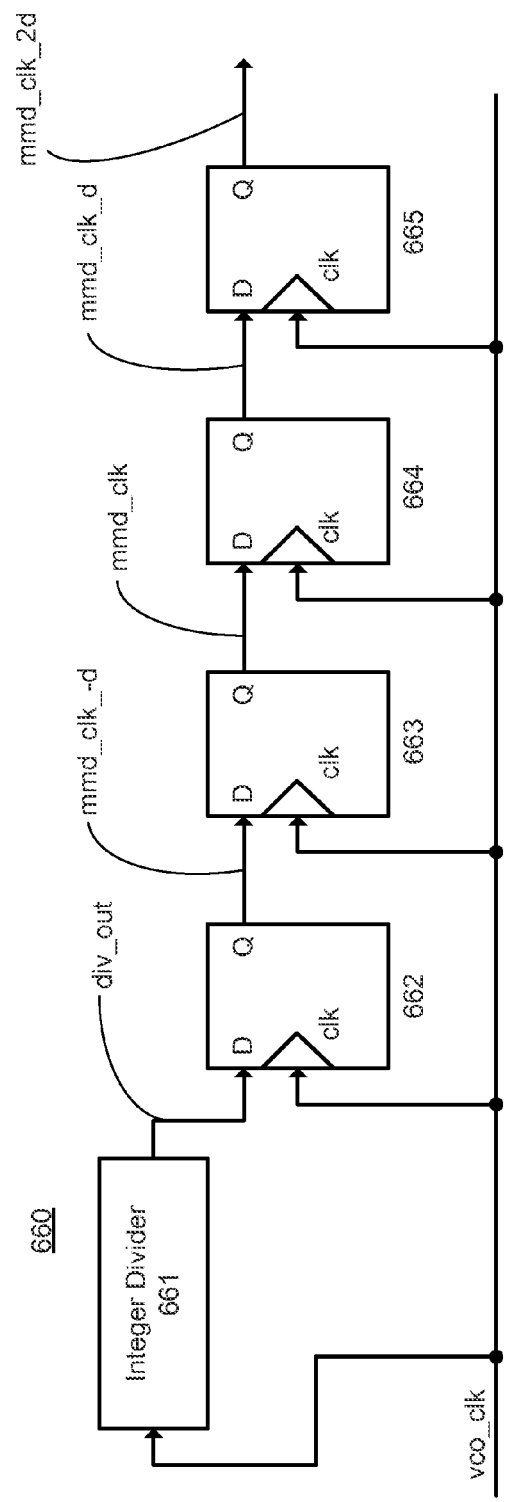

FIG. 6A-FIG. 6C illustrate hybrid FIR filtering components for filtering quantization noise according to an embodiment of the disclosure. In this embodiment, FIR filtering fractional-N PLL 600 of FIG. 6A is shown to include multiple PFDs 602, charge pumps 604, multi-phase feedback dividers 606 and loop filter 608 to filter the quantization noise. The output of the delta-sigma modulator 610 is applied to D-FF chain 612 to generate delayed outputs (shown as MC0 . . . MC6, MC7, MC8 . . . MC15 in circuit 650 of FIG. 6B), and these delayed outputs control multi-phase feedback dividers 606. In order to further reduce the quantization noise, fractional dividers are used instead of integer dividers.

As shown in FIG. 6A, this FIR filtering technique reduces quantization noise at the cost of increasing power consumption and chip area, due to the multiple PFDs, charge pumps and dividers. If, for example, the feedback divider uses a fractional divider based on MMDs and PIs, then, for a phase average granularity of 16, there would 16 analog MMDs, 16 analog PIs and 16 digital phase accumulators. In order to reduce this increase to the power consumption and chip area, embodiments may utilize a single common MMD for multiple PIs.

Thus, the MMD generates 4 clocks {mmd_clk_−d, mmd_clk, mmd_clk_d, mmd_clk_2d}, as shown by DFF chain 660 of FIG. 6C; the output of integer divider 661 is sampled by sequential DFFs 662-665, and output of these DFF chains are the "mmd_clk_−d", "mmd_clk", "mmd_clk_d" and "mmd_clk_2d" respectively. Thus, the delay between the sequential clock is 1 cycle of VCO clock. The input of 7$^{th}$ PI is connected to the "mmd_clk" and "mmd_clk_d", however, the input of other PIs may be selected from the group of clocks {(mmd_clk_−d, mmd_clk), (mmd_clk, mmd_clk_d), (mmd_clk_d, mmd_clk_2d)}.

Figure 7A:
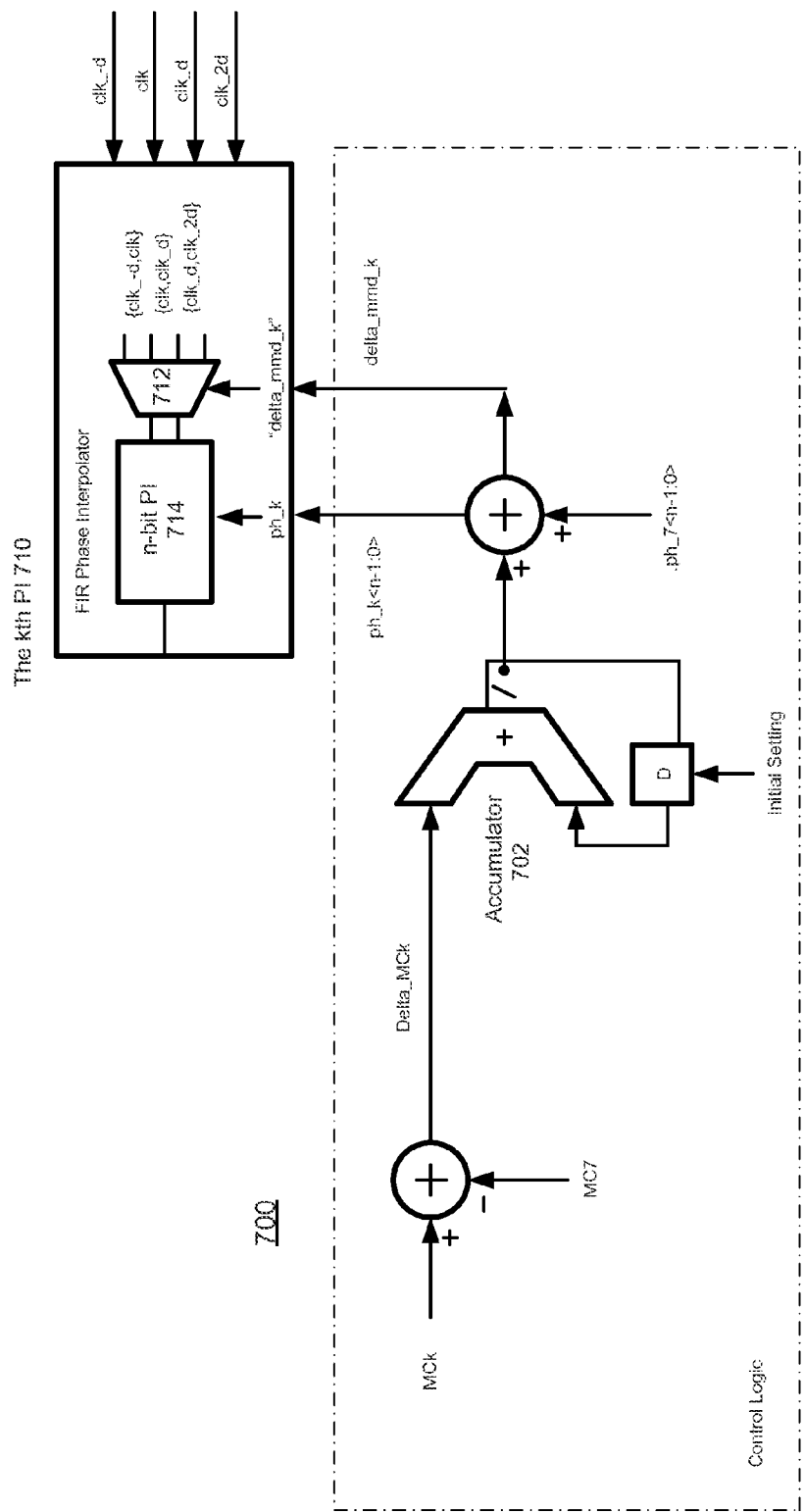
FIG. 7A is an illustration of divider control logic for a fractional divider according to an embodiment of the disclosure.

FIG. 7A is an illustration of divider control logic for a fractional divider according to an embodiment of the disclosure. In this embodiment, divider control logic 700 may comprise the divider control logic of any fractional divider except the reference divider. In this embodiment, "divider ratio difference" accumulator 702 is shown to receive the difference between any "k" DFF chain output MCk and MC7, referred to herein as "Delta_MCk."

The output of accumulator 702 is shown to be added with "ph7<n−1:0>." The integer output "delta_mmd_k" controls MUX 712 of k$^{th}$ PI 710, while the signal "ph_k" controls PI 714.

The range of "delta_mmd_k" depends on the corresponding sigma-delta modulator input pattern, the sigma-delta modulator architecture, the FIR pattern, the reference divider and the initial phase setting. The initial phase setting for these described embodiments may be different than the earlier described embodiments because the divider ratios for the multiple PIs are different.

For example, if the input of sigma-delta modulator is a constant, and if a multi-stage noise shaping (MASH1-1) sigma-delta modulator is used, if the FIR taps are 16, if the FIR pattern is (z-0+z-1+z-2+ . . . +z-15), and if the reference divider select MC7 as the input, the possible "delta_mmd_k" could be {−1, 0, +1}. In this example, if the "delta_mmd_k" is "−1", then the k$^{th}$ PI selects the group {mmd_clk_−d, mmd_clk} as the input for n-bit PI 714. If the "delta_mmd_k" is "0", then the k$^{th}$ PI selects the {mmd_clk, mmd_clk_d} as the input. If the "delta_mmd_k" is "1", then the k$^{th}$ PI select the {mmd_clk_d, mmd_clk_2d} as the input.

Figure 7B:
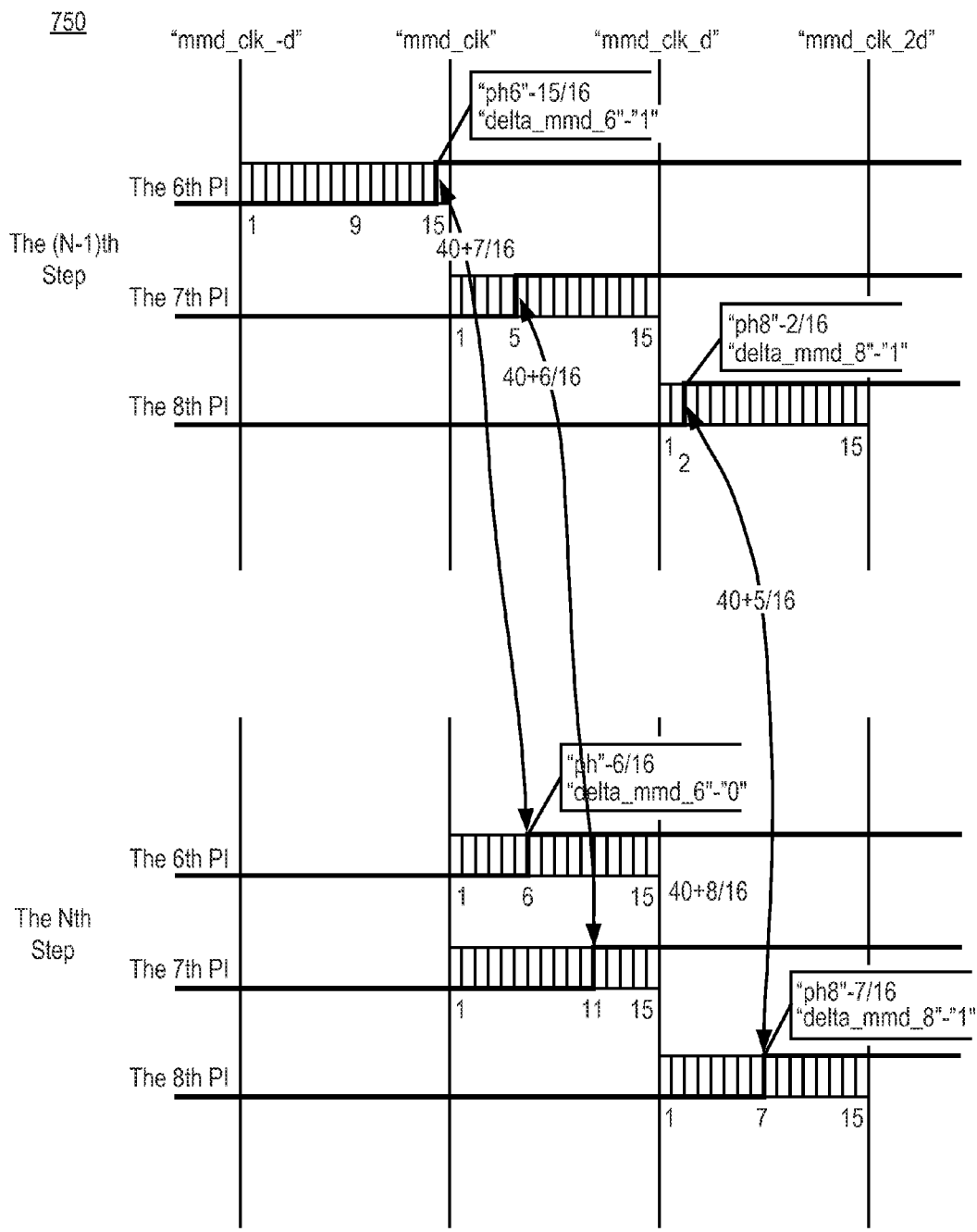
FIG. 7B and FIG. 7C are illustrations of the functionality of a utilized finite impulse response multi-phase fractional divider according to an embodiment of the disclosure.
Figure 7C:
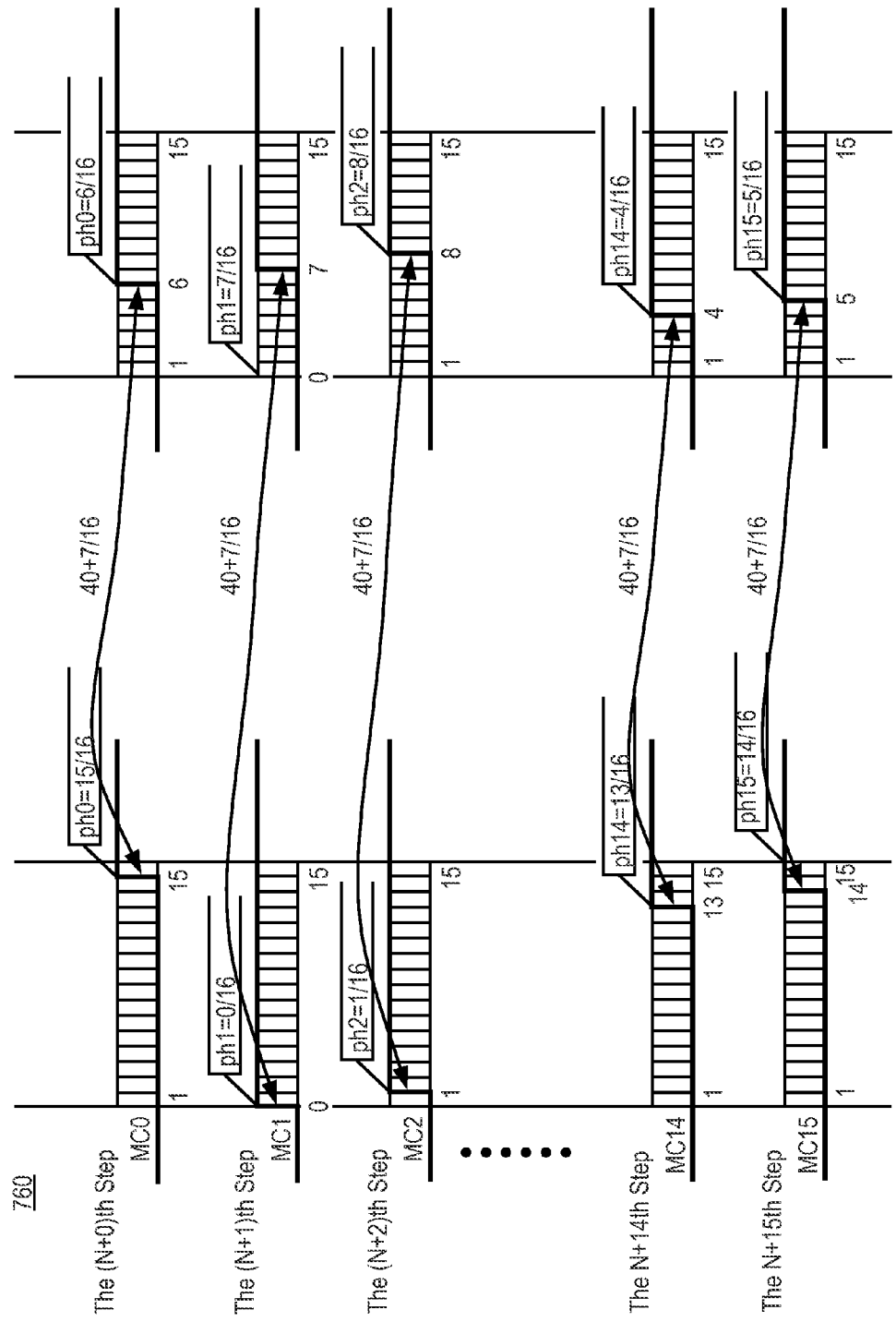

FIG. 7B and FIG. 7C are illustrations of the functionality of a utilized FIR multi-phase fractional divider according to an embodiment of the disclosure. Graph 750 and the following description describe an example of how an FIR multi-phase fractional divider may operate. In the (N−1)th iteration, the 7$^{th}$ PI may be set to a 5/16 phase step, while it realizes a 40+6/16 divider ratio in the Nth step; as a result, the divider ratio of the shared common MMD is set to 40, and the phase of the respective PI is set to 11/16. In contrast to the reference divider, in the (N−1)th iteration, "delta_mmd_6" is "−1", so the input clock to the $6^{th}$ PI is (mmd_clk_-d, mmd_clk), while the "ph" selects a 15/16 phase step for the respective PI.

Comparing the clock of $6^{th}$ PI and clock of $7^{th}$ PI, the difference in this example is −(−1+15/16)−5/16)=−6/16, it also means the output of the accumulator (e.g., accumulator 702 of FIG. 7) is −6/16. In Nth iteration, the divider ratio of $6^{th}$ fractional divider is 40+7/16, while the divider ratio of $7^{th}$ factional divider is 40+6/16, so the divider ratio in the Nth step is 40+7/16−(40+6/16)=+1/16; as a result, the accumulator output in the Nth iteration is −6/16++1/16=−5/16.

Furthermore, in the $N^{th}$ iteration, the phase of $7^{th}$ divider is 11/16, the output of the adder is 6/16, so the "delta_mmd_6" in the Nth iteration is "0", while the "ph6" in the Nth step is 6/16.

In the similar way, the "ph8" is 2/16, while "delta_mmd_8" is 1 in the (N−1) iteration; as a result, the accumulated phase difference between $8^{th}$ PI and the $7^{th}$ PI is 13/16. The divider ratio difference in the Nth step is −1/16, so the accumulator output is 12/16. "ph7" in the Nth step is 11/16, and the sum of "ph7" and accumulator output is 1+7/16. So "delta_mmd_8" in the Nth iteration is still 1, while "ph8" in the Nth iteration is 7/16.

Thus, in the above described embodiment, a group FIR divider utilizes a single, shared MMD. As MMDs operate at high frequency, reducing the instances of MMDs significantly reduces the power consumption and chip area of the FIR fractional divider.

The non-uniform of the PI causes the PI nonlinearity, as a result, it introduces tones and spurs and increases quantization noise in the medium frequency. Unfortunately the non-linearity of the PI also causes several spurs or tones in the low frequency; however, if the initial setting of accumulator 702 of FIG. 7A is configured, then the non-linearity of the PI may be greatly suppressed.

The initial phase setting in this embodiment is different than the other embodiments discussed above, because the divider ratios for multiple PIs are different. For example, if there are 16 PIs in an embodiment, the divider ratio may be set as follows:

(1) 40+5/16 (early, first to come)
(2) 40+6/16
(3) 40+5/16
(4) 40+7/16
(5) 40+5/16
(6) 40+4/16
(7) 40+5/16
(8) 40+6/16
(9) 40+7/16
(10) 40+5/16
(11) 40+5/16
(12) 40+4/16
(13) 40+6/16
(14) 40+6/16
(15) 40+5/16
(16) 40+4/16
(17) 40+5/16
(18) 40+7/16
(19) 40+5/16
(20) 40+4/16
(21) 40+5/16
(22) 40+4/16
(23) 40+5/16
(24) 40+4/16
(25) 40+5/16
(26) 40+4/16 (late to come)

If there are 16 PIs, the divider ratio (1) 40+5/16 may be initially set to the $16^{th}$ PI, the divider ratio (2) 40+6/16 may be initially set to $15^{th}$ PI, . . . the divider ratio (16) 40+4/16 may be initial set to $1^{st}$ PI; assuming that the $1^{th}$ PI initial phase is set to phase 0, so in the first clock time, it jumps from phase 0→phase 4.

In the second clock time, the $2^{nd}$ PI divider ratio may be set to 40+4/16, the same divider ratio of $1^{st}$ PI in the first clock. The divider ratio of $2^{nd}$ PI in the first time may be set to (15) 40+5/16. The initial phase may be set to phase 12. As a result, in the first clock time, the 2nd PI jumps from phase 12→phase 1. In the 2nd clock time, it jumps from phase 1→phase 5.

For the third PI, the divider ratio may be set to 40+6/16 at clock1, to 40+5/16 at clock2, to 40+4/16 at clock3. So its initial phase may be set as: initial phase=phase 2−(40+5/16)−(40+6/16)=phase 7; at clock1, it jumps from phase 7→phase 13; at clock, it jumps from phase 13→phase 2 . . . .

For the 16th PI, the initial phase may be set to phase 15−(40+5/16)−(40+5/16)−(40+5/16)−(40+5/16)−(40+7/16)−(40+5/16)−(40+4/16)−(40+5/16)−(40+6/16)−(40+7/16)−(40+5/16)−(40+5/16)−(40+4/16)−(40+6/16)−(40+6/16)−(40+5/16); as a result, at clock 16, the divider ratio of the $16^{th}$ PI may be set to 40+4/16, the same as the divider ratio of $1^{st}$ PI at clock 1, jumping from phase 15 to phase 3.

Graph 760 of FIG. 7C shows an example of initial phase pattern. Suppose that the phase of the first PI in the (N+0)th step is 15/16, and a divider ratio of 40+7/16 causes a phase jump to 6/16. By choosing the proper initial phase of second PI, it is possible to make the phase of second PI in the (N+1)th step 0/16, and a divider ratio of 40+7/16 lets the phase of the second PI jump to phase 7/16. In the same way, when choosing a specific initial phase setting of a different PI, it is possible for different PIs to jump their phases according to the pattern illustrated by graph 760.

In the design of a fractional-N PLL, such as FIR filtering fractional-N PLL 600 of FIG. 6A, the trade-off between in-band VCO noise and ΔΣ quantization noise constrains the choice of loop bandwidth. When the input frequency of the divider is too high to permit a proper operation of the programmable divider or counter, a pre-scalar may be used. A pre-scalar divides the input frequency by fixed ratios, and can therefore operate at higher frequencies because it does not suffer from the delays involved in counting and resetting. Furthermore, as the pre-scalar in a feedback divider works at very high frequency, multi-feedback dividers may occupy significant chip-space area and consume a high amount of power. Thus, a reduction of the size and power consumption of FIR feedback dividers would mitigate this effect.

Figure 8A:
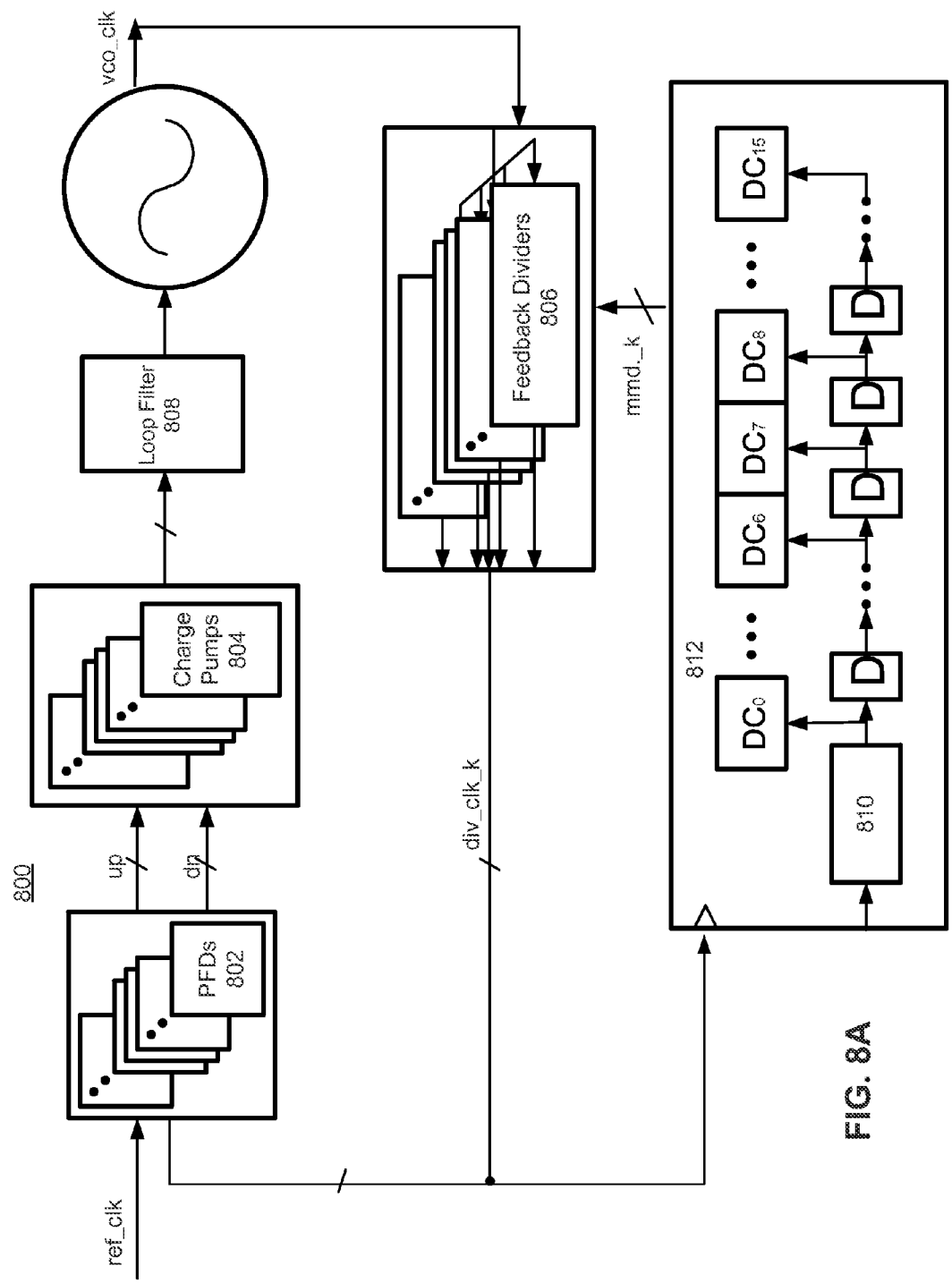
FIG. 8A-FIG. 8D are illustrations of a finite impulse response feedback divider circuit according to an embodiment of the disclosure.
Figure 8B:
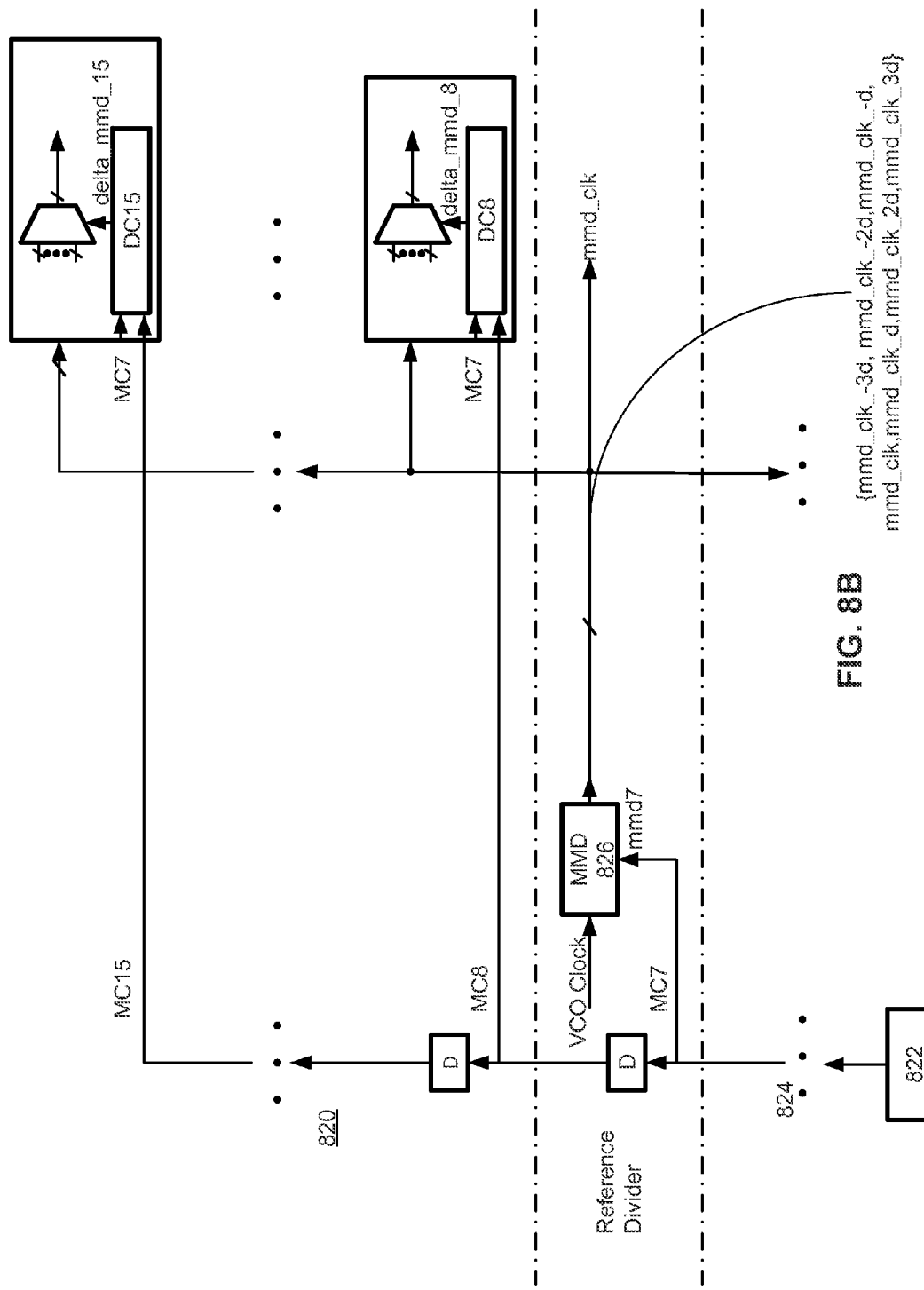
Figure 8C:
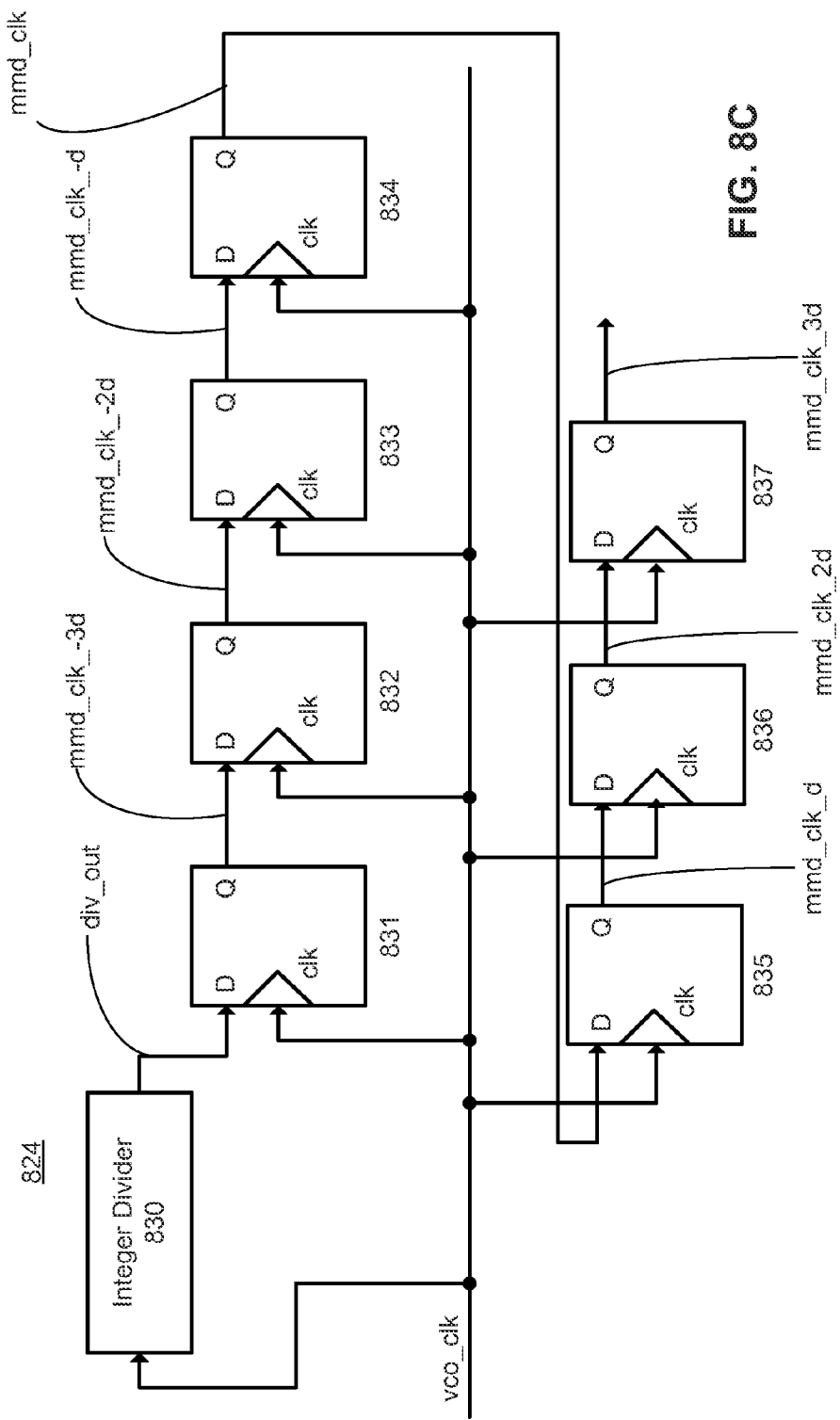

FIG. 8A-FIG. 8C are illustrations of an FIR feedback divider circuit according to an embodiment of the disclosure. In this embodiment, FIR filtering fractional-N PLL 800 of FIG. 8A is shown to include multiple PFDs 802, charge pumps 804, multi-phase feedback dividers 806 and loop filter 808 to filter the quantization noise.

The output of the delta-sigma modulator 810 is applied to D-FF chain 810 to generate delayed outputs, and these delayed outputs control multi-phase feedback dividers 806. As opposed to FIG. 6A, the control word is illustrated as "mmd_k" indicating that the feedback dividers are integer dividers rather than fractional dividers.

FIG. 8B is an illustration of an FIR feedback divider circuit according to an embodiment of the disclosure. In this embodiment, circuit 820 includes sigma-delta modulator 822, DFF chain 824 (which is only partially illustrated), shared MMD 826, a group of MUXs and control logic. As described above, the output of sigma-delta modulator 822 is applied to DFF chain 824 to generate "MC0 . . . MC6, MC7, MC8 . . . MC15." In this example, "MC7" is chosen to control the divider ratio of MMD 826. In this embodiment, no PIs and more than one MMD may be used.

In this embodiment, MMD 826 (i.e., the $8^{th}$ MMD of circuit 820) is shown to generate 7 clocks {mmd_clk_-3d, mmd_clk_-2d, mmd_clk_-d, mmd_clk, mmd_clk_d, mmd_clk 2d, mmd_clk_3d}. For example, as shown by DFF chain 824 of FIG. 8C, the output of integer divider 830 may be sampled by sequential DFFs 831-837; the output of this DFF chain may be used as those output clocks (meaning the delay between the sequential clock is 1 cycle of VCO clock). The output of $8^{th}$ feedback divider (referring back to FIG. 8B) is shown to be "mmd_elk", however, the input of plurality of MUXs selects one clock from the groups of clocks.

Figure 8D:
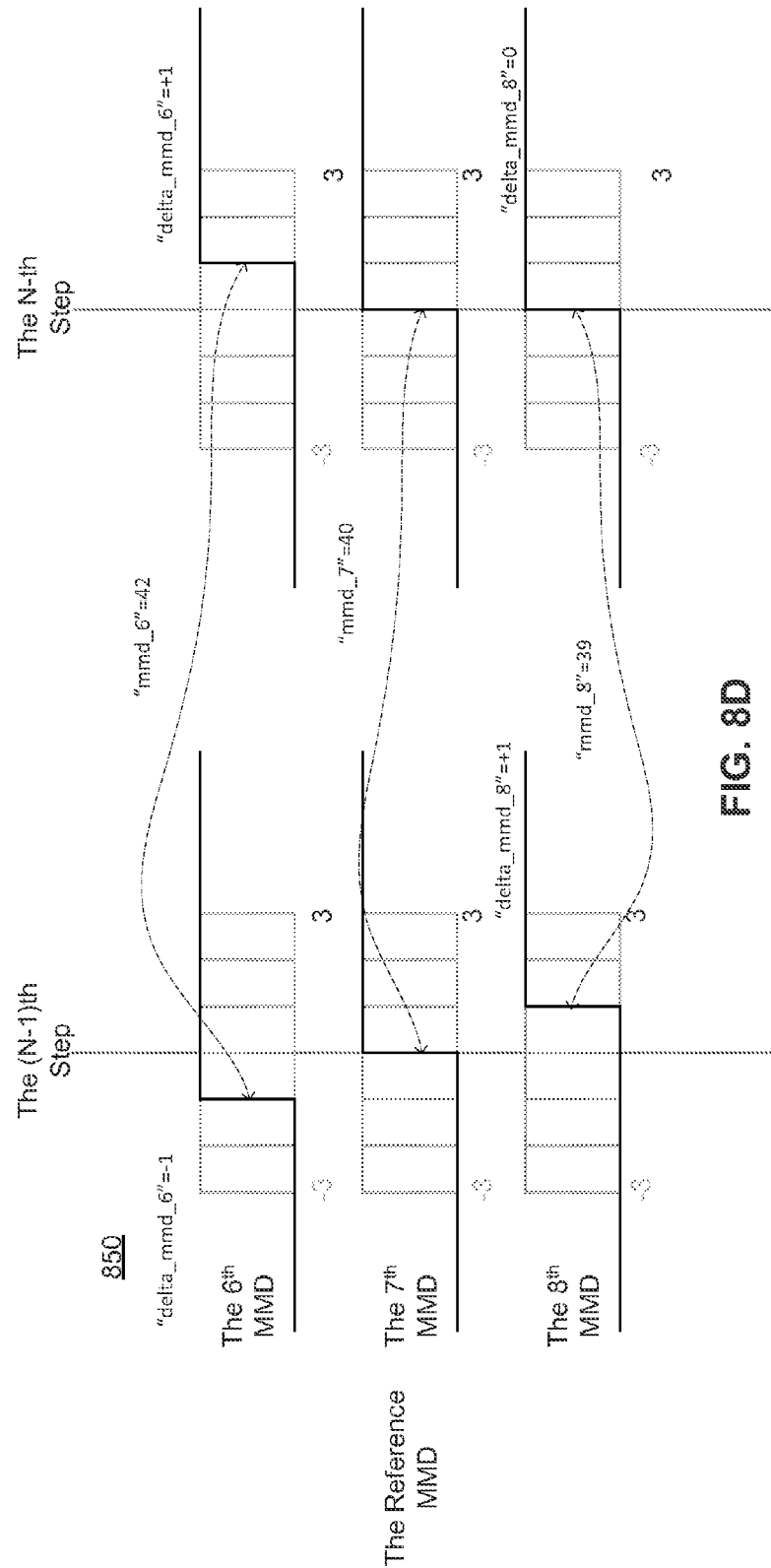

As mentioned above, the output of $8^{th}$ feedback divider in this example chooses the "mmd_clk." As illustrated in graph 850 of FIG. 8D, from the (N−1)-th step to N-th step, the MMD set to realize a divider ratio of 40. Supposing, for example, that the $6^{th}$ MMD wants to realize a divider ratio of 42 from the (N−1)-th step to N-th step, for example, if in the (N−1)-th step the $6^{th}$ MMD chooses the "mmd_clk_-d" as the output, then in the N-th step, the $6^{th}$ MMD will chose the "mmd_clk_d" as the output. In the same way, if the $8^{th}$ MMD uses the "mmd_clk_d" as the output in the (N−1)-th step, and it's to realize a divider ratio of 39, then the $8^{th}$ MMD will use the "mmd_clk" in the N-th step.

Figure 9:
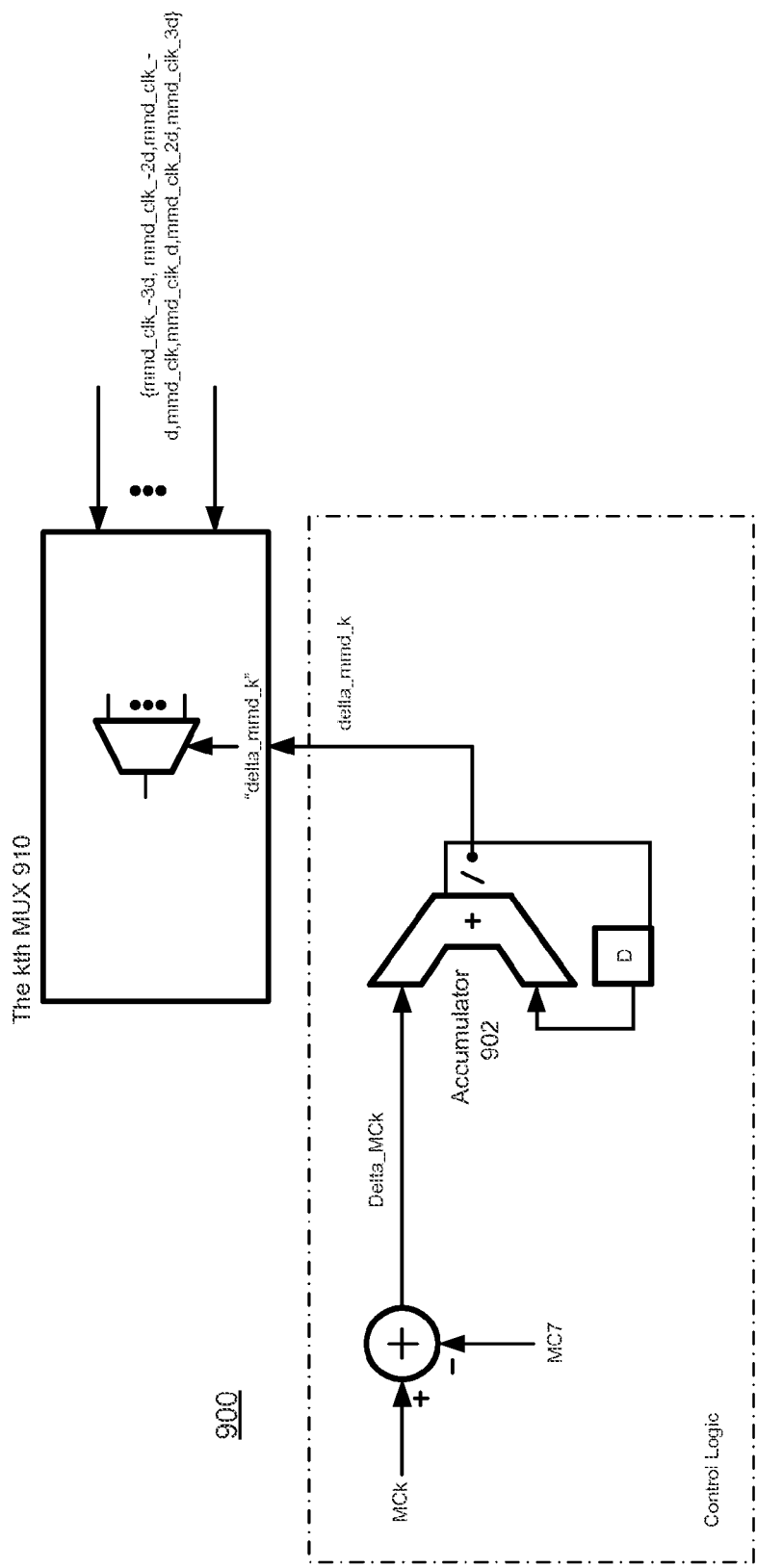
FIG. 9 is an illustration of divider control logic of fractional divider according to an embodiment of the disclosure.

FIG. 9 is an illustration of divider control logic of fractional divider according to an embodiment of the disclosure. In this example, control logic 900 may control any divider except the reference divider. "Divider ratio difference" accumulator 902 and the difference between the MCk and MC7, called as "Delta_MCk" are applied to this accumulator. The output of accumulator 902 may control MUX 910. The range of "delta_mmd_k" depends on the input pattern for the sigma-delta modulator, the sigma-delta modulator architecture, the FIR pattern, the reference divider and the initial phase setting. For example, if the input of sigma-delta modulator is a constant, and if a MASH1-1 sigma-delta modulator is chosen, and if the FIR taps are 16, and if the FIR pattern is (z-0+z-1+z-2+ . . . +z-15), and if the reference divider select MC7 as the input, the possible "delta_mmd_k" may be {−3, −2, −1, 0, +1, +2, +3}. If the "delta_mmd_k" is "−3", then the $k^{th}$ MUX selects the "mmd_clk_-3d" as the input. For another example, if the "delta_mmd_k" is "0", then the k h MUX select the "mmd_clk" as the input.

Figure 10:
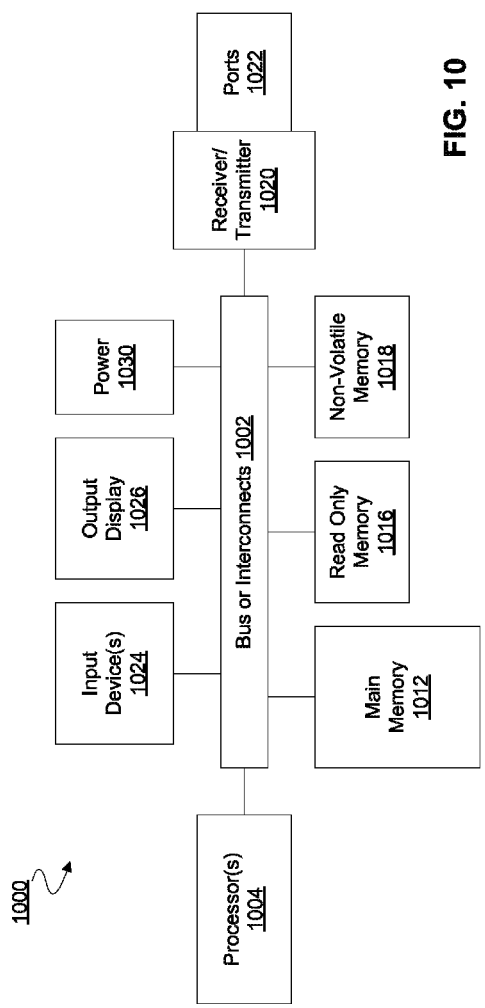
FIG. 10 is an illustration of an apparatus or system including logic utilize spread spectrum clock generated signals according to an embodiment of the disclosure.

FIG. 10 is an illustration of an apparatus or system including logic utilize SSC generated signals according to an embodiment of the disclosure. In this illustration, certain standard and well-known components that are not germane to the present description are not shown. In some embodiments, the apparatus or system 1000 (referred to herein generally as an apparatus) comprises a bus or interconnects 1002 or other communication means for transmission of data. The apparatus 1000 may include a processing means, such as one or more processors 1004 coupled with the interconnect 1002 for processing information. The processors 1004 may comprise one or more physical processors and one or more logical processors. The bus or interconnect 1002 is illustrated as a single interconnect for simplicity, but may represent multiple different interconnects or buses and the component connections to such interconnects may vary. The interconnect 1002 shown in FIG. 10 is an abstraction that represents any one or more separate physical buses, point to point connections, or both connected by appropriate bridges, adapters, or controllers.

In some embodiments, the apparatus 1000 further comprises a random access memory (RAM) or other dynamic storage device or element as a main memory 1012 for storing information and instructions to be executed by the processors 1004. RAM memory may include dynamic random access memory (DRAM). In some embodiments, memory of the apparatus may further include certain registers or other special purpose memory.

The apparatus 1000 may include a read only memory (ROM) 1016 or other static storage device for storing static information and instructions for the processors 1004. The apparatus 1000 may include one or more non-volatile memory elements 1018 for the storage of certain elements, including, for example, flash memory, hard disk drive, or solid-state drive.

One or more transmitters or receivers 1020 may also be coupled to the interconnect 1002. In some embodiments, the receivers or transmitters 1020 may be coupled to one or more ports 1022, where the ports may include, for example, one or more HDMI™ (High-Definition Multimedia Interface) ports, one or more MHL™ (Mobile High-Definition Link) ports, one or more DVI ports and/or the like.

In some embodiments, the apparatus 1000 includes one or more input devices 1024, where the input devices include one or more of a keyboard, mouse, touch pad, voice command recognition, gesture recognition, or other device for providing an input to a computing system. The apparatus 1000 may also be coupled via the interconnect 1002 to an output device 1026. In some embodiments, the display 1026 may include a liquid crystal display (LCD) or any other display technology, for displaying information or content to a user. In some environments, the display 1026 may include a touch screen that is also utilized as at least a part of an input device. In some environments, the display 1026 may be or may include an audio device, such as a speaker for providing audio information. The apparatus 1000 may also comprise a power device or apparatus 1030, which may comprise a power supply, a battery, a solar cell, a fuel cell, or other system or device for providing or generating power. The power provided by the power device or system 1030 may be distributed as required to elements of the apparatus 1000.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described. The illustrated elements or components may also be arranged in different arrangements or orders, including the reordering of any fields or the modification of field sizes.

The present invention may include various processes. The processes of the present invention may be performed by hardware components or may be embodied in computer-readable instructions, which may be used to cause a general purpose or special purpose processor or logic circuits programmed with the instructions to perform the processes. Alternatively, the processes may be performed by a combination of hardware and software.

Portions of the present invention may be provided as a computer program product, which may include a computer-readable non-transitory storage medium having stored thereon computer program instructions, which may be used to program a computer (or other electronic devices) to perform a process according to the present invention. The computer-readable storage medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of media/computer-readable medium suitable for storing electronic instructions. Moreover, the present invention may also be downloaded as a computer program product, wherein the program may be transferred from a remote computer to a requesting computer.

Many of the methods are described in their most basic form, but processes may be added to or deleted from any of the methods and information may be added or subtracted from any of the described messages without departing from the basic scope of the present invention. It will be apparent to those skilled in the art that many further modifications and adaptations may be made. The particular embodiments are not provided to limit the invention but to illustrate it.

If it is said that an element "A" is coupled to or with element "B," element A may be directly coupled to element B or be indirectly coupled through, for example, element C. When the specification states that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification refers to "a" or "an" element, this does not mean there is only one of the described elements.

An embodiment is an implementation or example of the invention. Reference in the specification to "an embodiment," "one embodiment," "some embodiments." or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects.

The invention claimed is:

1. A phase locked loop (PLL) circuit that generates a spread spectrum clock (SSC), comprising:
   a plurality of fractional dividers each comprising a multi-modulus divider (MMD) and a plurality of phase interpolators (PIs), wherein the MMD to receive an output from a voltage controlled oscillator (VCO) and generate a plurality of divided clock signals, and wherein the plurality of PIs to receive the divided clock signals from the MMD and output the respective fractional divider output signals; and
   a digital block including a sigma delta modulator, wherein the sigma delta modulator is to output an integer value used to generate a first control signal to control the divide ratio of the MMD for each of the plurality of fractional dividers to a same value, and to output a fractional value used to generate a second control signal to select the phases of the plurality of the PIs of each of the plurality of fractional dividers so that the average phase of each of the fractional divider output signals matches a desired phase step.

2. The PLL circuit of claim 1, wherein the number of PIs in each of the fractional dividers equals a denominator of the desired phase step.

3. The PLL circuit of claim 1, wherein the number of PIs in each of the fractional dividers is less than a denominator of the desired phase step.

4. The PLL circuit of claim 1, wherein the signal delta modulator of the digital block comprises a (MASH1-1) sigma-delta modulator.

5. The PLL circuit of claim 1, further comprising:
   a charge pump and loop filter, coupled between the phase-frequency detector and the VCO, to filter the up/down pulses from the phase-frequency detector and provides an output signal to control the VCO.

6. A phase locked loop (PLL) circuit that generates a spread spectrum clock (SSC), comprising:
   a plurality of fractional dividers each comprising a multi-modulus divider (MMD) and a plurality of phase interpolators (PIs), wherein the MMD to receive an output from a voltage controlled oscillator (VCO) and generate a plurality of divided clock signals, and wherein the plurality of PIs to receive the divided clock signals from the MMD and output the respective fractional divider output signals; and
   a digital block including a sigma delta modulator, wherein the sigma delta modulator is to output an integer value used to generate a first control signal to control the divide ratio of the MMD for each of the plurality of fractional dividers according to a Finite Impulse Response (FIR) pattern to suppress nonlinear behavior of FIR filters of the plurality of PIs.

7. The PLL circuit of claim 6, wherein the MMD of each of the plurality of factional dividers comprises a single MMD shared between the plurality of PIs.

8. The PLL circuit of claim 6, wherein an initial phase pattern for the plurality of fractional dividers is selected to suppress nonlinear behavior of the FIR filters of the plurality of PIs.

9. The PLL circuit of claim 6, wherein the signal delta modulator of the digital block comprises a (MASH1-1) sigma-delta modulator.

10. The PLL circuit of claim 6, further comprising:
    a phase-frequency detector; and
    a charge pump and loop filter, coupled between the phase-frequency detector and the VCO, to filter the up/down pulses from the phase-frequency detector and provides an output signal to control the VCO.

11. A Finite Impulse Response (FIR) fractional divider for a phase locked look (PLL) circuit comprising:
    a sigma-delta modulator to output a modulated reference signal:
    a plurality of digital flip-flops to receive the output of the sigma-delta modulator and to generate delayed outputs including a reference delayed output;
    a plurality of multi-modulus dividers (MMDs), each corresponding to one of the plurality of digital flip-flops, to generate a plurality of divided signals, each corresponding to a respective delayed output;

a multiplexer to output one of the plurality of divided signals; and control logic for controlling a selection of the multiplexer output based, at least in part, on a difference between a selected delayed output and the reference delayed output.

12. The FIR divider of claim 11, further comprising:

a divider ratio accumulator for controlling the section of the multiplexer output.

13. The FIR factional divider of claim 11, wherein the signal delta modulator comprises a (MASH1-1) sigma-delta modulator.

14. The FIR fractional divider of claim 13, wherein the input of the MASH1-1 sigma-delta modulator is constant.

* * * * *